(12) United States Patent
Schuessler

(10) Patent No.: US 6,196,466 B1
(45) Date of Patent: Mar. 6, 2001

(54) DATA COMPRESSION METHOD USING MULTIPLE BASE NUMBER SYSTEMS

(75) Inventor: Frederick Schuessler, Baiting Hollow, NY (US)

(73) Assignee: Symbol Technologies, Inc., Holtsville, NY (US)

( * ) Notice: Subject to any disclaimer, the term of this patent is extended or adjusted under 35 U.S.C. 154(b) by 0 days.

(21) Appl. No.: 09/329,191

(22) Filed: Jun. 9, 1999

Related U.S. Application Data

(60) Provisional application No. 60/088,607, filed on Jun. 9, 1998.

(51) Int. Cl.[7] .................................................. G06K 19/06
(52) U.S. Cl. ........................................ 235/494; 235/462.1
(58) Field of Search .................................... 235/494, 487, 235/431, 462.1; 341/67; 365/185.2; 380/20

(56) References Cited

U.S. PATENT DOCUMENTS 5,703,907 * 12/1997 James ................................... 375/240
5,825,830 * 10/1998 Kopf .................................... 375/340

OTHER PUBLICATIONS

AIM International, Inc., International Symbology Specification–MaxiCode, May 8, 1997 issue.*

* cited by examiner

Primary Examiner—Thien M. Le
Assistant Examiner—Uchau Le
(74) Attorney, Agent, or Firm—Gary Serbin

(57) ABSTRACT

A data compression method is defined, which achieves high efficiency when encoding source data drawn from two or more data subsets of differing sizes, and where these subsets are distributed throughout the source message. Methods for encoding and decoding these subsets are disclosed, and a typical bar coding application is described.

18 Claims, 3 Drawing Sheets

SYMBOL PARTIALLY ENCODED USING
MULTI-BASE ENCODING METHOD

ENCODED DATA (in the two-dimensional MicroPDF417 symbol):

927P1A2B3C4D#211A2B3C4D5E6F7

DATA COMPRESSION METHOD USING MULTIPLE BASE NUMBER SYSTEMS

CROSS-REFERENCE TO RELATED APPLICATIONS

This application derives priority from U.S. Provisional Application Ser. No. 60/088,607 filed Jun. 9, 1998.

FIELD OF THE INVENTION

The present invention relates to a data compression method that is well-suited to efficient encoding of source data that is a mix of two or more well-defined subsets of the possible message contents, as is commonly found in serial numbers and other messages that are commonly represented in optical codes, such as bar codes, and radio frequency identification (RFID) tags.

BACKGROUND OF THE INVENTION

Prior General-Purpose Compaction Schemes

Many approaches have been devised to efficiently compact a user's source data, based on recognizing redundant information in the source message. Some schemes, such as Huffman coding, work on a character-by-character basis, and define an encoded representation that assigns the fewest bits to the most commonly used characters. However, the message cannot be decoded, unless either the statistical probabilities of the different characters are known a priori to the decoder, or the message contains a "dictionary" that discloses the specific character-to-bit assignments that were used. Neither approach is compatible with bar coding applications or radio frequency identification RFID applications.

Many other schemes, such as those used in file-compression programs like PKZip, inherently include a "dictionary" of compressed strings that is built up as each file is analyzed for compression. However, a very short message (such as a bar-coded serial number) seldom contains enough substring redundancy for this approach to work.

These general-purpose compression schemes are not well-suited to solving the unique problem faced by the bar code industry, which is to encode a relatively short messages (of nearly random character content) in the smallest possible physical space.

Prior Compaction Schemes from Bar Code Symbologies

Efficient compaction of a user's source data has always been a primary goal in the design of bar code symbologies for specific applications. In early bar code symbologies, there was usually a direct correspondence between the application's expected source character set and the bar code's symbol character set (the bar code's predefined set of bar and/or space patterns). For example, the well-known Interleaved-Two-of-Five symbology defines 10 legal patterns, each of five bars or five spaces, and these 10 patterns are directly assigned to the 10 decimal digits which comprise the source character set for the intended application. Another symbology, Code 39, defines 44 legal bar/space patterns in its symbol character set, and these directly correspond to the 44 data characters (digits, capital letters, and some punctuation characters) supported in the source character set. In both of these cases, the bar code symbology inherently supports one fixed subset (numbers, or letters plus numbers) of the possible source character set of 7-bit ASCII characters or 8-bit bytes. In general, the larger the fixed subset of supported data characters, the larger each corresponding bar code character must be. For example, each digit in Interleaved 2-of-5 requires seven unit widths (of the 5 bars or spaces representing each digit, two of the bars or spaces are double-width), whereas each data character in Code 39 requires 12 unit widths (of the 5 bars and 4 spaces representing each character, 3 are double-width).

More recent bar code symbologies, and recent two-dimensional matrix codes, typically have a more flexible correspondence between the source data characters and the resulting bar and space patterns of symbol characters, and usually define support for two or more subsets of the possible 7- or 8-bit source character set. For example, PDF417 is a two-dimensional stacked barcode, which predefines several common subsets of the 8-bit source data which can benefit from more efficient encoding. PDF417's symbol characters (bar/space patterns) can, depending upon the values of preceding symbol characters, represent the set of decimal digits, or the set of capital letters, the set of lower-case letters, or the full set of all possible 8-bit values. As another example, Code One is a two-dimensional matrix code, where each black or white cell within its data area represents one bit of encoded data. However, each Code One character (i.e., each group of 8 data bits) does not necessarily directly correspond to a particular group of 8 source data bits. This is because, in addition to a "Byte" code set (which is a full 8-bit representation of each 8-bit source character), Code One defines five different subsets of the source data (ASCII, C40, Decimal, Text, and EDI). Each of these subsets allows source characters to be encoded using fewer than 8 bits each. For example, the Code One Decimal code set can encode a string of three decimal digits from the source message into a single number which can be represented in 10 bits (averaging 3.33 bits per character, rather than the 8 bits per character that would be required if each source byte were directly encoded in the Byte code set). As a second example, Code One also defines a subset of the input values consisting of decimal digits, capital letters, and four punctuation characters. This "EDI" code set encodes three successive source characters (if all are from this predefined 40-character subset) into a Base 40 number which can be represented in 16 bits (averaging 5.33 bits per character). It can be seen from these examples that in general, the larger the predefined subset of source characters, the larger the numerical base of the number that represents them, and thus more bits per character are required to encode them. Similar approaches to efficient encoding of source-message subsets have been designed for most recent bar code and matrix symbologies. The specific choices of subsets may differ, depending on the expected characteristics of source messages, but the encodation mechanisms are quite similar to the examples shown above.

Note that, although the average number of bits per character can be a fraction rather than an integer, no current symbology allows the direct representation of a fractional bit. Instead, the encoding algorithm looks for fixed-length groups of source characters (all of which must be members of the same subset), and converts the data values into a fixed number of bits. In general, the larger the group, the more efficient the encoding, but the less likely the source message will contain a homogeneous grouping. For example, a "group" of one digit requires 4 bits to represent it, but a group of two requires only seven bits (averaging 3.5 bits per digit), and a group of three requires only 10 bits (averaging just 3.33 bits per digit). However, this more efficient grouping of three cannot be used if the source message contains runs of only one or 2 digits, separated by letters or other non-members of the digit subset.

In prior symbology designs, the typical approach to this problem has been to include an "escape" character within the predefined subset, so that an occasional non-member source character can be encoded. However, the non-member characters are inevitably encoded with relatively poor efficiency. For example, Code One's C40 code set encodes letters and numbers at an average of 5.5 bits each, and can encode non-member characters, but at an average of 11 bits each (much worse than their source representation in 8 bits).

Finally, these special subset encodation modes usually provide some method of changing to a different pre-defined subset (by making a non-data "latch character" a member of the defined subset). In this way, if the message consists of a string of letters followed by a string of digits, the letters can be encoded using a letter-oriented subset, and then a "code latch" character can be encoded, so that the subsequent source characters can be encoded in a more-efficient digit-oriented code set. If a single number separated two strings of letters, then if the predefined letter subset also includes a non-data "code shift" character, the entire message can be encoded in the letter-oriented subset with fairly good efficiency.

An alternative to a defined non-data "code latch" character is to encode run-length information prior to the start of the basis-encoded data. After the decoder processes enough encoded bits to represent the number of input characters that was specified by the run-length, the decoder "knows" that the basis-encoded data has ended, without encountering a specific "code latch" character.

However, the relative "cost" of any of these basis-changing approaches (the "code latch" and "code shift" characters, or the encoded run-length) becomes greater, the more often the source data moves from one defined subset to another. For example, if the source message consists of alternating letters and numbers, then encoding the message in two alternating bases (e.g., encoding the first letter in a letter-subset, encoding a shift to a number-subset, encoding the number, encoding a shift to a letter-subset, encoding the next letter, and so forth) would not be efficient.

Instead, the current state-of-the art in bar code design would be to specify a third subset that is the union of the two desired subsets, thus including capital letters, numbers, and possibly one or more punctuation or non-data shift/latch characters. The design would assign each source-message letter a value (for example, 0 through 25), assign each source-message digit a value (for example, 26 through 35), and assign higher values to the punctuation or non-data characters (for this example, which loosely corresponds to the EDI code set of Code One, add four punctuation characters, assigned values 36 through 39). In this example, this constitutes a predefined set of 40 members, each represented by a unique Base-40 value in the range 0 through 39. The encoder would then encode each fixed-length group of three successive source characters (call them c1, c2, and c3) into a single 16-bit Base 40 number, by assigning the three characters their Base-40 values (call them v1, v2, and v3) by using the formula:

$$\text{16-bit Base 40 number} = (v1*40*40) + (v2*40) + v3$$

The decoder can recover the three original data characters from the 16-bit Base 40 number by first dividing by 40*40 (the quotient will equal v1), then dividing the remainder by 40 (the new quotient will equal v2, and the new remainder will equal v3); a table lookup converts v1, v2, and v3 back to c1, c2, and c3.

This numerical-basis-conversion approach to efficiently encoding data subsets is now commonplace in the bar code symbology art. Depending upon the expected data content statistics of the intended application, different symbologies have chosen different subsets of data plus non-data characters, and therefore different bases have been used, but the mechanics remain the same. For example, if we define a subset similar to Code One's EDI set, but using only two punctuation characters, rather than 4, we would assign Base 38 values, rather than Base 40 values, to each source character of the subset, and the resulting formula would be:

$$\text{16-bit Base 38 number} = (v1*38*38) + (v2*38) + v3$$

In theory, any choice of basis (e.g., Base 38 vs. Base 40) that properly reflects the size of its character subset is equally efficient. But in practice, some efficiency can be lost, if small groups of input characters are used, and if the resulting basis-converted number leaves a large fractional bit unused (this was indicated earlier, when groups of 1, 2, and 3 digits were compared). For example, by choosing a group of three Base 38, rather than three Base 40, characters, we have lost a little efficiency, because the largest resulting number (three successive characters whose values are 37) is 54,871, whereas the largest Base 40 number is 63,999. Thus the Base 40 number conveys more possible values (64,000, vs. 54872), and thus conveys more information (the base 40 number conveys 15.967, whereas the Base 38 number conveys 15.744 bits). A larger grouping minimizes the fractional-bit inefficiency, but also increases the risk that the source message won't contain a large-enough homogeneous string to be efficiently encoded.

An important limitation, common to all of the encodation methods previously known in the art, is that for any given substring of successive characters from the input message, only one numerical basis at a time is applied. That is, a symbology may support three subsets (and three bases), such as digits (Base 10), capital letters plus two punctuation characters (Base 28), and a third subset (the union of the first two) consisting of digits plus capital letters plus two punctuation characters (Base 38). If a message contains a substring that is a long run of digits, it will be encoded in Base 10, if it contains a long run of letters, that substring will be encoded in Base 28, and if it contains a substring consisting of alternating numbers and letters, that substring will be encoded in Base 38.

A new encodation scheme is needed to provide for even greater compression of data.

The object of the present invention is to provide a multibase encodation scheme allowing for even greater compression of data that can presently be achieved using single numerical base encoding methods.

Another object of the invention is to provide for a storage medium containing the message which has been encoded using the new encodation scheme.

Another object of the invention is to provide a decoder for decoding a message which was encoded using the new multibase encodation scheme.

SUMMARY OF THE INVENTION

Applicant's invention overcomes the inefficiencies of the prior art encodation schemes by encoding a message using multiple numerical bases. The use of multiple numerical bases to encode different message characters provides for a more compact binary message.

The applicant's invention allows for further enhancement of encoding density by suppressing leading zeros in the binary numbers representing an encoded message character or a group of encoded message characters. Different methods of suppressing leading zeros are disclosed.

The applicant's invention further provides for a character map field within the encoded binary message. The character map field allows the decoding system to recognize the numerical bases used in encoding different characters. Different methods of using character map field are disclosed.

An encoder of the applicant's invention allows the information to be efficiently stored in a machine recognizable form. The encoded message can be stored on an optical storage medium such as bar code, magnetic medium such as a magnetic storage drive, or a semiconductor storage medium such as a radio frequency identification tag (RFID tag).

The decoder is disclosed for decoding a message which was encoded using the applicant's multibase encoding method.

Various applications of the present invention are disclosed.

DESCRIPTION OF THE PREFERRED EMBODIMENT OF THE INVENTION

Figure 1:
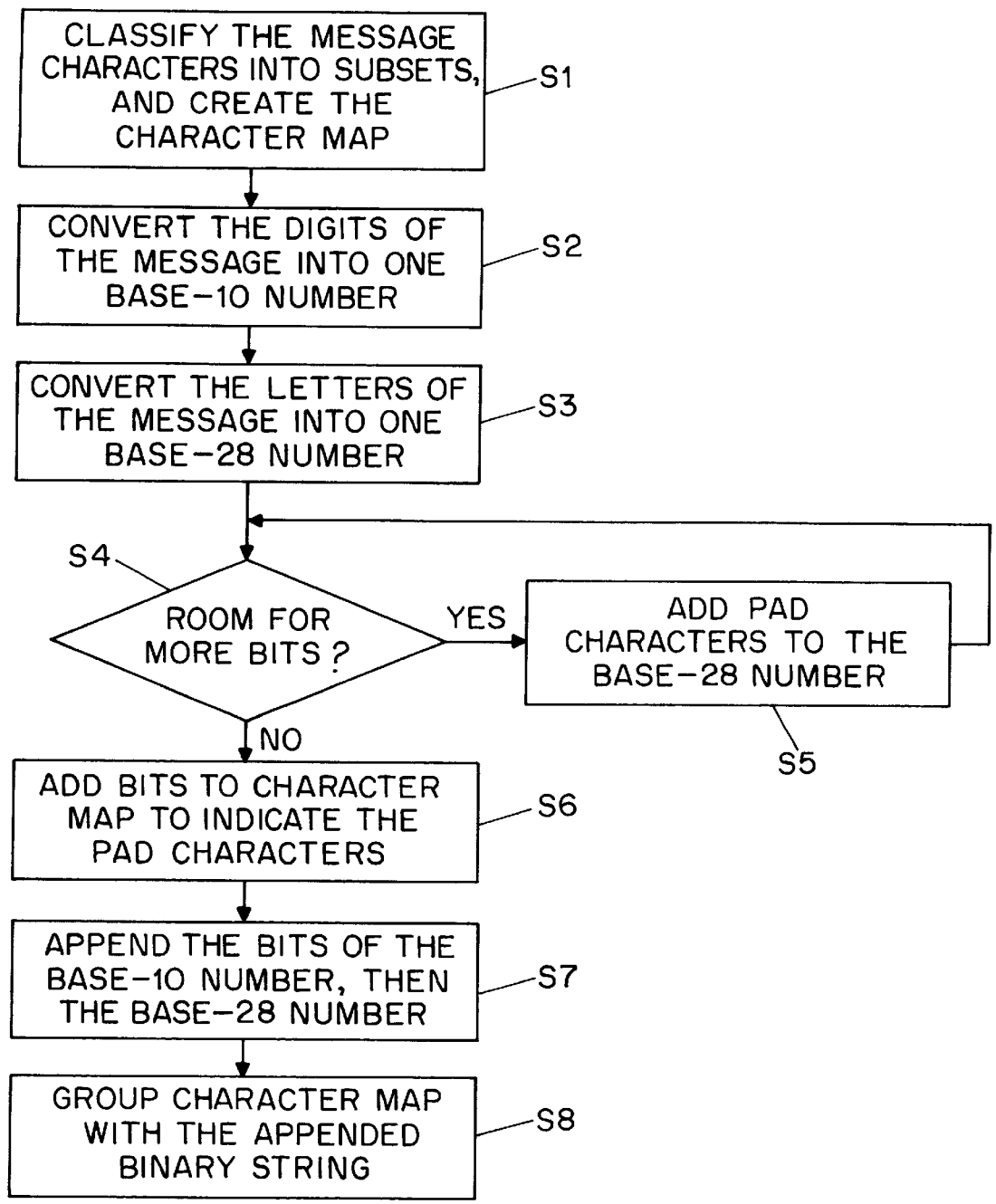
FIG. 1 is a flow chart of an encoding method according to the preferred embodiment of the invention.

Representing a given string of letters and digits as Base 38 numbers is inherently less efficient than it would be if the digits of that string were represented as a Base 10 number and the letters of that string were separately represented as a Base 28 number. For example, the number of bits required to represent a string of ten Base 38 characters (which in this example happens to contain a random mix of four letters and six numbers) can be calculated (from elementary information theory) as log (38) =52.48 bits (which, in order to encode, must be rounded up to 53 bits). In contrast, the total number of bits needed to separately represent six Base 10 characters and four Base 28 characters is only log (10) Plus log (28) equal to 19.93 bits (which we must round up to 20) plus 19.22 bits (which we must round up to 20) or 40 bits, compared to 53 for a single Base 38 number.

Character Map

Of course, such a dual-base encoding would not be useful, if the relative positions of the letters and digits within the source string were not known to the decoder, either implicitly or explicitly. Some product identification schemes mandate that certain character positions are always letters and others are always numerals. But even when the relative positions are not fixed, this information can easily be encoded using a "character map", which, in a case where two subsets are interspersed, can be efficiently represented as a string of bits, where for example each '0'0 bit within the character map string means that a member of the "digits" subset was at the corresponding position in the source string (message), and each '1' bit means that a member of the "letters" subset was at the corresponding position in the source string(message). This character map, preferably encoded preceding the encoded Base 10 and Base 28 numbers, tells the decoder how to recreate the original source string. In this example, the character map adds 10 bits to the previous total of 40, but the resulting total of 50 bits is still more efficient than the 53 bits needed using Base 38 encoding, to encode exactly the same data message drawn from exactly the same predefined subsets of source characters.

In fact, the dual-base encoding is always at least slightly more efficient than the equivalent single-base encoding, so long as the message to be encoded contains at least as many characters of the smaller character subset as of the larger subset. Using the previous example, Base-38 encoding has a fixed "cost" per character of 5.248 bits, and so the average cost per character is again 5.248 bits. Base-10 has a "cost" of 4.322 bits per character (including the character-map bit), Base 28 has a "cost" of 5.807 bits per character (again including the character-map bit), and so the average dual-base cost per character is (4.322+5.807)12 or 5.065 bits per character, which is significantly better (over a long message) than Base-38's 5.248 bits per character. The advantage for dual-base encoding becomes even more significant, if the message contains more numbers (the smaller base) than letters.

The General Technique of Multibase Encoding

It can be seen that this concept, reducing a message to two interleaved messages of smaller bases, can be extended to more than two bases, if the statistical characteristics of the source message are such that additional efficiency can be achieved. For example, consider a company that wishes to bar-code its work-in-process components with a complex scheme for module-level identification, including identification (down to revision levels) for multiple components within the module. Depending upon the company's database and part-numbering structures, this may result in a data message which is always comprised of four small subsets of the full set of numbers, digits, and punctuation characters. The company could then implement a four-base encoding method, where each subset may be a very small base. For example, it may be that the data can be parsed into two Base 4 digit subsets (needing two bits to represent each character) and two Base 8 capital letter subsets (needing 3 bits per character). Including the character map, where in this case two bits per character are required (to represent the location and subset of each character within the message), this encoding will average 4.5 bits per character (if the message has equal representation from all four subsets), which is better than the 5.065 bits per character that dual-base encoding would have accomplished. Since this technique is, as was just shown, not limited to using exactly two subset bases, the technique of the present invention is generally described as multibase encoding.

Implicitly or Explicitly Establishing the Length of the Character Map

The efficiency calculations shown above implicitly are for the case where multibase encoding is either applied to the entire message, or applied from some middle point until the end of the message. If, instead, it is desired to encode a beginning or middle portion of the message using multibase encoding, but then switching to another encodation method (such as a single-base method) for the remainder of the message, then a mechanism must be provided to inform the decoder as to the number of multibase-encoded characters. Another way of stating the same point is that the decoder needs to know the length of the character map. In some company specific applications, including many product-identification schemes, this is a predetermined fixed length, and thus can be known a priori to the decoder. Other applications may require an explicit encoded length indicator. This will slightly worsen the bits-per-character efficiency of the multibase encoding, but will often still be more efficient than the alternative encodation schemes, especially if characters from the smaller-base subset(s) occur in the message more frequently than the other(s).

In the case where multibase encoding is either applied to the entire message, or applied from some middle point until the end of the message, and the decoder knows how many total bits are unused and available for encoding (e.g., the remaining bit capacity of the bar code) at the point where multibase encoding begins, neither a predetermined fixed length nor an explicit encoded length indicator are required.

To illustrate, we will use the dual-base (base 10 and base 28) example described above, and a short trailing message of "89A1 B2". Assume that a decoder is aware that 32 bits of bar code capacity happen to remain at the point where the decoder encounters the start of the multibase encoding section (i.e., where the character map portion, preceding all of the base-encoded data, begins).

The decoder examines the first bit of the character map, and sees a '0' bit (denoting a character from the base-10 subset). The decoder calculates how many bits are needed to base-10-encode one character, and come up with the result of 4 bits. The second bit of the character map is also a '0' and the decoder thus recalculates the total base-10-data requirement to be 7 bits (and so far, no bits are required for the base-28 data). At this point, the total bit requirement is 9 bits (2 for the character map, and 7 for the data), which is less than the remaining bit capacity of the bar code, so the decoder proceeds further. Examining the next character map bit, a '1', the decoder now adds a 5-bit requirement for the base 28 character, plus one more bit for the character map, for a new total of 15 bits, still less than the remaining capacity. After similarly processing the next three character map bits, an '0' followed by a '1' followed by another '0', the newly-updated requirements are: 6 bits thus far for the character map, plus 14 bits required to encode 4 digits as a single base-10 value, plus 10 bits required to encode two base-28 characters as a single base-28 value, for a total of 30 bits. At this point, only two bits remain in the bar code's capacity of 32 bits, which is not enough to encode an additional character. Thus the decoder now knows that the encoded character map was exactly six bits in length, and it now knows that following the 6-bit character map was a 14 bit-long base-10 value followed by a 10-bit-long base-28 value.

It may be that, at the point in the message where multibase encoding is desired, fewer data characters remain to be encoded than would exhaust the remaining bit capacity of the bar code. In this case, the message can be "padded" with a character or character sequence that will be recognized as padding when it appears at the end of a message, so that the padding can be discarded by the decoder. Typically, one would ensure that the largest base of the multibase system contains a character that can be recognized as padding when appearing at the end of the message. In our example, the Base-28 set could include a character that normally serves to separate data elements within the message, and thus would be recognized as a Pad if it occurred one or more times at the end of the message. The pad character would be encoded and decoded exactly the same as any of the other characters of the Base-28 set. After the decode process had completed the trailing pad character(s) would be recognized and deleted.

Also, a character map can have one additional bit ("dummy bit") for signaling the end of the binary string. The program disclosed with respect to the bar code in FIG. 3 used the dummy bit at the end of the character map.

Efficient encoding of Leading Zero bits

One additional novel compaction technique can be applied to the present multibase encoding invention, as well as to the traditional single-base encoding. This technique can be invoked to further reduce the number of bits needed to encode a string of characters into a base value, when the resulting value begins with a number of leading '0' bits. This is a typical result, when for instance a serial number scheme has a fixed length in the database, and thus low-numbered items have a serial number with many leading '0' digits, or when a base-28 message begins with several characters from the start of its subset's alphabet (which are assigned individual base 28 values of 0, 1, etc). Using a Base 28 example: the minimum number of bits that is guaranteed to hold any 3-character Base 28 sequence is log (28 −1) or 15 bits. However, the base 28 value for the string "ABC" (if 'A' is assigned a value of 0, 'B' a value of '1' and 'C' a value of 2) is (0*28)+(1*28)+3=31, which only requires 5 bits to encode. Thus, the particular base 28 value for "ABC" has ten leading 0 bits. We could enhance the encodation method described above, by adding two 3-bit Leading-Zero-Count fields (one for each Base) just prior to the character map section. Each field could be defined to encode the number of suppressed leading '0' bits (or, alternately, that number divided by two). Then, the three-bit Leading Zero Count for the Base-28 section could replace 10 bits of '0' with three bits (encoding 10/2 or 5), for a net savings of 7 bits. Alternatively, the Leading-Zero-Count fields could be placed after the character map section before their respective numerical base values.

FIG. 1 shows, in flow chart form, the method for performing multibase encoding. In step S1 the encoder classifies the message characters to be encoded using multibase encoding method into different subsets and creates a character map (bit-map) of relative positions of the characters from these subsets. Although not limited to, in FIG. 1 it is assumed that the message contains digit and letter characters (letters and punctuation marks). In the preferred embodiment the digit characters are classified as a digit subset and the letter characters are classified as a letter subset. Because there are 10 possible digits (0 through 9), a numerical base of 10 is used to process the digit subset and each of the possible digits is assigned a numerical base-10 value. Numerical base of 28 (26 letters and punctuation characters or padding characters) is used to process the letter subset, and each of the possible letters is assigned a base-28 value. In step S2 the digit characters of the message are converted into one base-10 binary number. In step S3 the letter characters of the message are converted into one base-28 binary number. In the embodiment if FIG. 1 the total length of the encoded binary message string is fixed. Therefore, if the encoded message characters do not create a binary string with a sufficient number of bits, a pad character (characters) will be added by the encoder to match the length of the binary string with the expected length. Typically, the pad characters will be encoded as part of the base-28 number. Ultimately, upon decoding, the decoder will recognize the pad characters and will remove them from the decoded message. In step S4 the encoder checks if the base-28 binary number needs more bits in order to match the expected length of the binary string. If the answer is "yes", the flow chart proceeds to step S5 where a pad character is added. From S5 we go back to S4 to again check to the length of the created padded binary message string. Finally, when the result of the test in step S4 is negative, either with or without passing through step S5, the flow chart proceeds to step S6. In step S6 the character map is updated to indicate the presence of pad characters that might have been added in step S5. The flow chart then proceeds to step S7 where the base-28 binary number is appended to the base-10 binary number. In step S8 the character map from S6 and the appended binary string from S7 are grouped together to create a full encoded binary message string. It should be noted that the algorithm FIG. 1 did not use the leading-zero compression scheme or the character map length field feature disclosed above.

Figure 2:
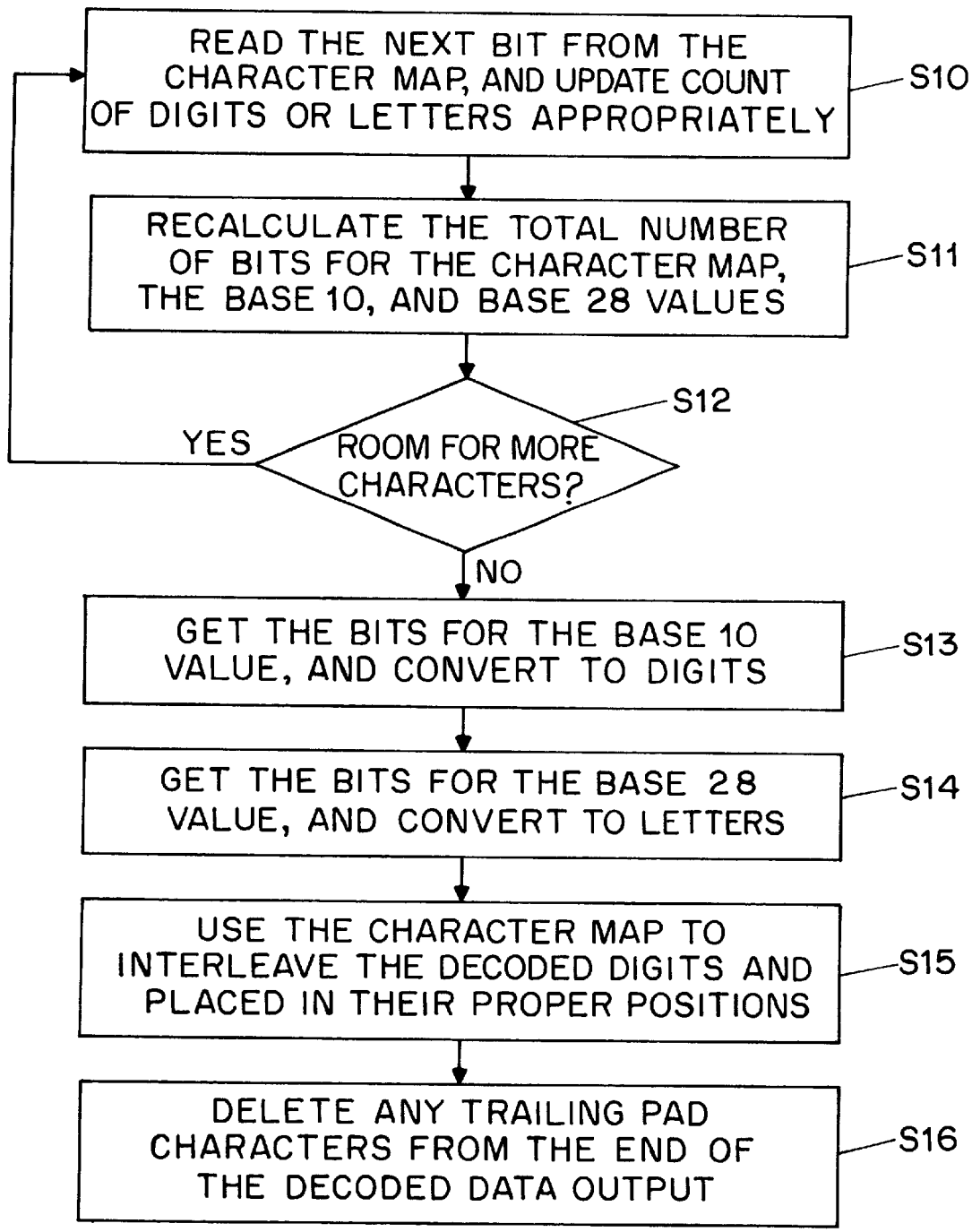
FIG. 2 is a flow chart of a decoding method according to the preferred embodiment of the invention.

FIG. 2 shows the corresponding decoding method. The algorithm starts by finding the beginning of the character map field (not shown for clarity purposes). In the preferred embodiment, only two numerical bases are used (base-10 and base-28), and therefore only one bit is needed to identify a numerical base for any encoded character in the character map. The number of bases used and their respective representation in the character map ("0" for base-10 character and "1" for base-28 character) the decoder in step S10 reads one bit from the character map and updates the count of characters of the appropriate numerical base designated by the character map bit. Knowing the total length of the encoded binary string, in step S11 the decoder calculates the total number of bits used up so far for the character map, the base-10 value and the base-28 value. In step S12 the decoder determines if the calculated total number of bits is less then the remaining capacity of the bar code. If the answer is "yes", the flow chart loops back to step S10 and the decoder proceeds to read the next character map bit and to recalculate the total number of bits used so far. The loop consisting of steps S10, S11 and S12 continues until the result of step S12 is negative, at which point number of bits used to encode the digit subset using base-10 value is known and the number of bits used to encode the letter subset using base-28 value is also known. Having determined the total number of bits used to represent values from each of the two character subsets, the decoder proceeds to step S13. In step S13 the bits representing base-10 value of the digit subset are converted to actual digit characters. In step S14 the bits representing base-28 value of the letter subset are converted to actual letter characters. In step S15 the converted digit and letter characters are interleaved using the character map and placed in their appropriate positions in the decoded data output. In step S16 the decoder deletes any trailing pad characters from the decoded data output to produce a decoded message.

Figure 3:
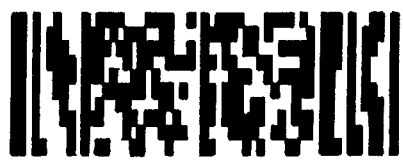
FIG. 3 illustrates a two-dimensional bar code symbol partially encoded using the invented multibase encoding method.

FIG. 3 illustrates a two-dimensional bar code symbol partially encoded using the invented multibase encoding method. The data encoded in the symbol is 92 7P 1A2B3C4D $^G{}_S$ 21 1A2B3C4D5E6F7. Character $^G{}_S$ is a group separator character. As disclosed above the multibase encoding method can be combined with other methods to encode different portions of a message. In the present example the message was encode using two encoding methods, ALPHA and Multibase methods. The portion of the message encoded using the Multibase method is 1 A2B3C4D5E6F7.

Following is an annotated output of a program used to encode the bar code symbol of FIG. 3.

(Spaces added for clarity. Explanatory comments start with //)
Data to encode: 92 7P 1A2B3C4D$^G{}_S$21 1A2B3C4D5E6F7
// THE encoded bit patterns follow:
METHOD: 1101
// Bit pattern 1101 indicates that encoder will use Method App1,
// which is appropriate for data of this format (indicated by leading '92')
// in this format, '21' always follows the $^G{}_S$
METHOD__APP1: 1 11 0111 0111
// first bit of '1' means uses Alpha encoding for first data field (which always ends with a $^G{}_S$ character)
// bits '11' means that the '92' was followed by a 1-digit/1-Alpha Data Identifier (in this case, '7P')
// '0111' (binary '7') encodes the numeric portion '7' of '7P';
// the second '0111' encodes the alpha portion 'P' of '7P' (P is the 7th legal letter for a Data Identifier)
ALPHA:111 0001 00000 111 0010 00001
111 0011 00010 111 0100 00011 11010
// the data "1A2B3C4D $^G{}_S$ is encoded in Alpha mode, which encodes letters in 5 bits each, and
// encodes digits in 7 bits each. For example the first two characters are:
// '1' is encoded as '111 0001', and
// 'A' is encoded as '00000'
// the last character, $^G{}_S$, is encoded as '11010'
10
// these two bits, following the required $^G{}_S$ character, indicate the choice of encoding mode
// for the remaining data. In this case, '10' indicates MultiBase encoding.
MULTIBASE:
1
01010101010101
1101011010000111 00010010
1011000100101 1010
// 1st line: the first bit indicates that the default punctuation character '—' is assumed;
// 2nd line: the character-map bits (0 for numbers; 1 for letters)
// note that an extra '1' bit appears at the end of the map, because this barcode symbol has a
// capacity of 138 bits, but only 137 bits were needed to encode this message.
// 3rd line: the Base 10 representation of the digits (stored in groups of up to 16 bits,
// where the least significant 16 bits are stored first).
// In this example, '1234567' was encoded; its binary value is actually 00010010 1011000100101
// 4th line: the Base 28 representation of the letters (also stored least-significant-word first).
PADS: <none>
// although the character map indicates one more Base 28 character than is actually present,
// there is no need to actually encode the Pad in this case - the decoder will be able to calculate that
// none of the bits of the last Base 28 character shown in the map were actually encoded.

As can be seen from the above program, the multibase encoding method can be readily applied for encoding messages having a mix of digits and letters.

The encoder must have elements for accomplishing the encoding steps disclosed above. The decoder must have elements for accomplishing the decoding steps disclosed above. The encoder and the decoder could be implemented in software and in hardware. Hardware decoders are typically faster, but they are not as flexible and do not allow for major algorithm modifications. The present invention could be incorporated into the present encoders and decoders. The encoders can be integrated into printers or other devices used to encode information on a physical media. Decoder can be integrated into the devices, such as bar code readers, for processing the encoded information and outputting a decoded message.

The present invention is directly applicable to bar code encoding, where bar code density is of great importance. Also, the present encodation scheme can be used in radio frequency identification tag, where the amount of stored information and the time of transmission are critical to the cost, size and operation of the system. The invention can also be used in magnetic data storage devices, such as floppy discs, and hard discs. Moreover, the invention can be used to encode information stored on a semiconductor media, such as a memory chips, as well as optical storage media such a compact discs.

Without further analysis, the foregoing will so fully reveal the gist of the present invention that others can, by applying current knowledge, readily adapt it for various applications without omitting features that, from the standpoint of the prior art, fairly constitute essential characteristics of the generic or specific aspects of this invention and, therefore, such adaptations should and are intended to be comprehended within the meaning and scope of the following claims.

What is claimed is:

1. A method of encoding a plurality of message characters for storing on an information carrying media, said method comprising the steps of:
   a) classifying message characters to be encoded into a plurality of character subsets;
   b) assigning a different numerical base for each of said character subsets, said numerical base for a given character subset corresponding to a number of characters in said character subset;
   c) converting each message character of a character subset into a numerical value based upon a numerical base assigned to said character subset;
   d) converting a sequence of numerical values representing message characters of said character subset into a subset binary number;
   e) repeating steps c and d for all character subsets;
   f) grouping the subset binary numbers in a predetermined order to construct a multibase-encoded representation of said plurality of message characters; and
   g) storing the said multibase-encoded representation on the information carrying media.

2. The method of claim 1, wherein the grouping step includes appending the subset binary numbers in a predetermined order.

3. The method of claim 1, wherein the grouping step includes the steps of:
   a) calculating a number of leading zeros in a subset binary number;
   b) encoding said number of leading zeros into a binary zero-count number;
   c) modifying said subset binary number by removing its leading zeros;
   d) associating said binary zero-count number with said modified subset binary number;
   e) repeating steps a through d for other subset binary numbers; and
   f) grouping the binary zero-count numbers and their associated modified subset binary numbers in a predetermined order to construct the multibase-encoded representation of said plurality of message characters.

4. The method of claim 3, wherein the step of grouping the binary zero-count numbers and their associated modified subset binary numbers includes appending each of said binary zero-count numbers with its associated subset binary number; whereby each of said binary zero-count numbers immediately precedes its associated subset binary number.

5. The method of claim 3, wherein the step of grouping the binary zero-count numbers and their associated modified subset binary numbers includes the steps of:
   a) forming a zero-count group by appending all the binary zero-count numbers;
   b) forming a subset binary group by appending all the subset binary numbers;
   c) appending said zero-count group and said subset binary group, whereby said subset binary group follows said zero-count group.

6. The method of claim 1, wherein step f includes a step of creating a character bitmap identifying relative positions of the message characters from different character subsets.

7. The method of claim 6, further including the step of storing said character bitmap on the information carrying media in association with said multibase-encoded representation of said plurality of message characters.

8. The method of claim 6, further including the steps of:
   a) encoding a length of the character bit-map into a bit-map length field; and
   b) storing said bit-map length field and said character bit-map on the information carrying media in association with said multibase-encoded representation of said plurality of message characters.

9. The method of claim 1, wherein the grouping step includes the steps of:
   a) creating a character bit-map identifying relative positions of the message characters from different character subsets;
   b) calculating a number of leading zeros in a subset binary number;
   c) encoding said number of leading zeros into a binary zero-count number;
   d) modifying said subset binary number by removing its leading zeros;
   e) associating said binary zero-count number with said modified subset binary number;
   f) repeating steps a through d for other subset binary numbers; and
   g) grouping the binary zero-count numbers and their associated modified subset binary numbers in a predetermined order to construct the multibase-encoded representation of said plurality of message characters.

10. The method of claim 9, further including the step of storing said character bit-map on the information carrying media in association with said multibase-encoded representation of said plurality of message characters.

11. The method of claim 9, further including the steps of:
a) encoding a length of the character bit-map into a bit-map length field; and
b) storing said bit-map length field and said character bit-map on the information carrying media in association with said multibase-encoded representation of said plurality of message characters.

12. The method of claim 1, wherein said information carrying media is an optical storage media.

13. The method of claim 12, wherein said optical storage media is a bar code.

14. The method of claim 1, wherein said information carrying media is a semiconductor storage media.

15. The method of claim 14, wherein said semiconductor storage media is a radio frequency identification (RFID) tag.

16. The method of claim 1, wherein said information carrying media is a magnetic storage media.

17. An information carrying substrate containing a number of encoded message characters, said substrate comprising:
a) a first plurality of message characters encoded using a first numerical base; and
b) at least a second plurality of message characters encoded using a second numerical base;
whereby a set of binary representations of message characters of said first and said second pluralities of message characters are grouped in a predetermined order.

18. An encoder for encoding a number of message characters to be stored on an information storage medium, said encoder comprising:
a) first means for encoding a first plurality of message characters using a first numerical base; and
b) a second means for encoding at least a second plurality of message characters using a second numerical base; and
c) a combiner for grouping a set of binary representations of message characters of said first and at least said second pluralities of message characters in a predetermined order.

* * * * *